United States Patent
Migita

(10) Patent No.: US 7,831,952 B2
(45) Date of Patent: Nov. 9, 2010

(54) DESIGNING APPARATUS, DESIGNING METHOD, AND PROGRAM

(75) Inventor: Koji Migita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 362 days.

(21) Appl. No.: 12/032,347

(22) Filed: Feb. 15, 2008

(65) Prior Publication Data

US 2008/0201680 A1    Aug. 21, 2008

(30) Foreign Application Priority Data

Feb. 20, 2007  (JP)  ............................. 2007-039617

(51) Int. Cl.
    *G06F 17/50* (2006.01)
(52) U.S. Cl. ......................................... 716/18; 716/12
(58) Field of Classification Search .................. 716/12, 716/18
    See application file for complete search history.

(56) References Cited

U.S. PATENT DOCUMENTS

| 5,586,046 | A  | * | 12/1996 | Feldbaumer et al. | .......... | 716/18 |
| 7,448,003 | B2 | * | 11/2008 | Zhang et al. | .................... | 716/4 |
| 2006/0071821 | A1 | * | 4/2006 | Kimura | ...................... | 341/50 |
| 2008/0224727 | A1 | * | 9/2008 | Verbauwhede et al. | ......... | 326/8 |

FOREIGN PATENT DOCUMENTS

JP    2005-149012    6/2005

* cited by examiner

*Primary Examiner*—Stacy A Whitmore
*Assistant Examiner*—Magid Y Dimyan
(74) *Attorney, Agent, or Firm*—Staas & Halsey LLP

(57) ABSTRACT

An apparatus, method, and program for designing a semiconductor device having a storage unit configured to a differential signal library for use in generation of a design data of a differential signal cell that receives or outputs differential signals. The apparatus includes a logic synthesis unit performing logic synthesis based on the differential signal library configured to the storage unit. The apparatus generates a netlist design data of the differential signal cell that receives or outputs the differential signals.

19 Claims, 11 Drawing Sheets

DESIGNING APPARATUS, DESIGNING METHOD, AND PROGRAM

CROSS-REFERENCE TO RELATED APPLICATIONS

This application is related to and claims the benefit of priority of Japanese Patent Application No. 2007-39617, filed on Feb. 20, 2007, the entire contents of which are incorporated herein by reference.

BACKGROUND

1. Field

The embodiments relate to a designing apparatus, a designing method, and a program.

2. Description of the Related Art

FIG. 1 is a flowchart showing a procedure of a conventional digital circuit designing method. At operation S101, a digital circuit structure is analyzed on the basis of register transfer level (RTL) design data.

As shown in FIG. 1, libraries 111 and 112 are single-ended signal libraries for use in generation of netlist design data of single-ended signal cell that receive or output single-ended signal. A single-ended signal is one signal based on a reference voltage (for example, a ground voltage). The libraries 111 include a plurality of cell libraries having different transistor threshold voltages Vth. The libraries 112 include a plurality of cell libraries having different supply voltages. Different kinds of libraries are prepared according to the supply voltages and transistor threshold voltages Vth.

As further shown in FIG. 1, at operation S102, a predetermined library is selected from the plurality of libraries 111 and 112 having different supply voltages and/or different transistor threshold voltages Vth. Information of the selected library is stored.

As further shown in FIG. 1, at operation S103, logic synthesis is performed on the basis of the RTL design data using the selected library 111 or 112 to generate netlist design data 104 of single-ended signal cell.

As further shown in FIG. 1, at operation S105, timing analysis is performed on the basis of the netlist design data 104.

As further shown in FIG. 1, at operation S106, if the timing is verified to be met as a result of the timing analysis the netlist design data 107 is stored in a storage unit, and then the process is terminated. If the timing is verified not to be met as a result of the timing analysis, the process proceeds to operation S108.

As further shown in FIG. 1, at operation S108, whether to change the selected library is determined. If the selected library is determined not to be changed, the process returns to operation S103, and the logic synthesis is performed again using another cell included in the same library. If the selected library is determined to be changed, the process proceeds to operation S109.

As further shown in FIG. 1, at the operation S109, the library selected at operation S102 is excluded from selection candidates. The process then returns to operation S102. Another library is selected at operation S102, and the logic synthesis is performed again.

In analog circuits, low amplitude differential signals are used as clock signals for the purpose of high-speed operations.

Additionally, in analog circuit design, which is performed manually, an operation of converting differential signals into or from single-ended signals and a operation of converting operating voltage ranges of low amplitude differential signals are needed since the low amplitude differential signals are handled.

On the other hand, in digital circuits, single-ended signals, but not differential signals, are used when the clock frequency is low. As further shown in FIG. 1, in digital circuit design, only single-ended signal cells are designed on the basis of the single-ended signal libraries 111 and 112.

That is, logic synthesis is not performed on differential signals. When the clock frequency of digital circuits is high, the circuits are designed manually to consider interference from others, such as crosstalk.

With an increase in the operation speed of circuits, there is an increasing demand for an increase in the operation speed of circuits using low amplitude differential signals in digital circuits. In addition, treatment of low amplitude differential signals through logic synthesis based on RTL design data is desired in digital circuit design.

Since logic synthesis based on the RTL design data cannot be performed regarding digital circuits using low amplitude differential signals in the aforementioned conventional designing methods, efficient circuit design cannot be performed.

SUMMARY

According to an aspect of an embodiment, an apparatus is provided for designing a semiconductor device including a storage unit configured to a differential signal library for use in generation of a design data of a differential signal cell that receives or outputs differential signals, and a logic synthesis unit performing logic synthesis based on the differential signal library configured to the storage unit to generate a netlist design data of the differential signal cell that receives or outputs the differential signals.

BRIEF DESCRIPTION OF THE DRAWINGS

These and/or other aspects and advantages will become apparent and more readily appreciated from the following description of the embodiments, taken in conjunction with the accompanying drawings of which.

DETAILED DESCRIPTION OF THE EMBODIMENTS

Figure 1:
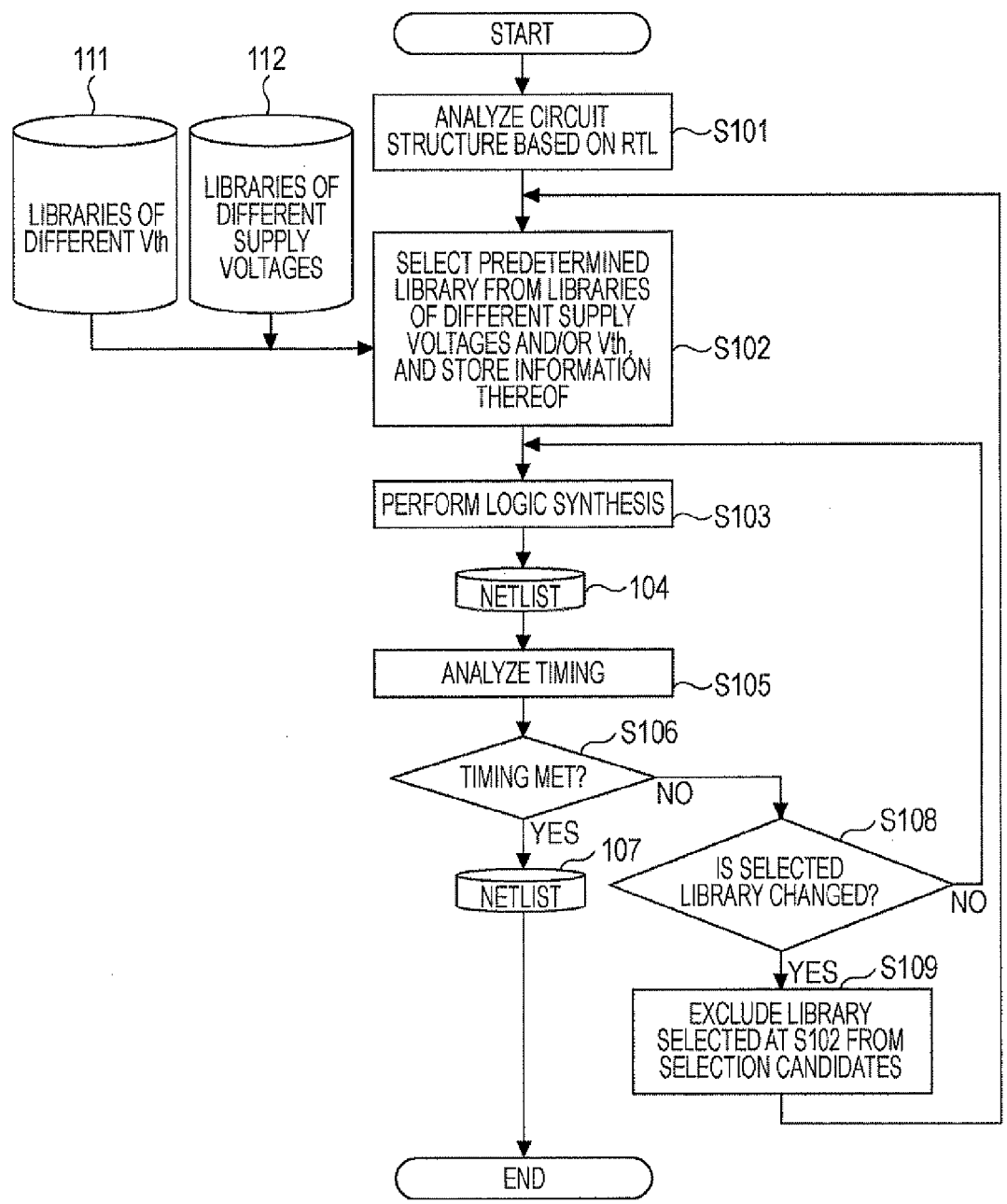
FIG. 1 is a flowchart illustrating a conventional digital circuit designing method.

Reference will now be made in detail to the embodiments, examples of which are illustrated in the accompanying drawings, wherein like reference numerals refer to the like elements throughout. The embodiments are described below to explain the present embodiment by referring to the figures.

According to an aspects and/or advantages of embodiments will be set forth in part in the description which follows and, in part, will be apparent from the description, or may be learned by practice of the embodiment.

Figure 2:
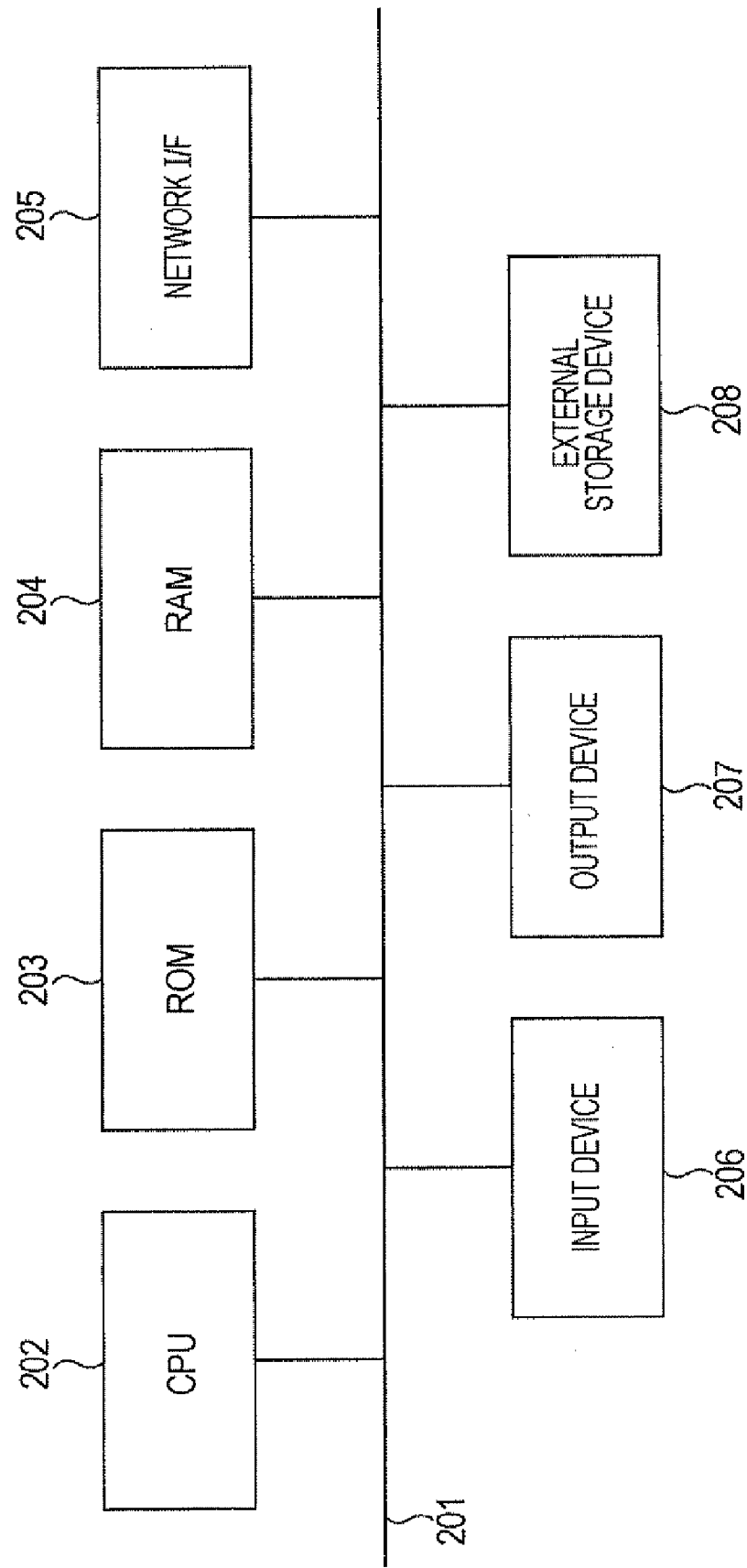
FIG. 2 is a block diagram that illustrates an example of a configuration of a designing apparatus according to an embodiment.

FIG. 2 illustrates an example of a configuration of a designing apparatus according to an embodiment. The designing apparatus includes a computer, and performs a procedure of a designing method according to an embodiment.

As shown in FIG. 2, a central processing unit (CPU) 202, a read only memory (ROM) 203, a random access memory (RAM) 204, a network interface (I/F) 205, an input device 206, an output device 207, and an external storage device 208 are connected to a bus 201.

As further shown in FIG. 2, the CPU 202 performs data processing and arithmetic processing, and control various kinds of elements connected thereto through the bus 201. A controlling procedure (for example, a computer program) of the CPU 202 is previously stored in the ROM 203. The CPU 202 executes the computer program, thereby starting the procedure. The external storage device 208 stores computer programs. The CPU 202 executes the computer programs after being copied in the RAM 204. The RAM 204 is used as a working area for input/output and transmission/reception of data and a temporary storage for controlling various elements. The external storage device 208 may be, for example, a hard disk storage device or a CD-ROM. The contents stored in the external storage device 208 are not erased even if the external storage device 208 is turned off. The external storage device 208 stores libraries and design data. The CPU 202 executes the computer programs stored in the RAM 204, thereby performing example processes illustrated in FIGS. 4 to 6.

As further shown in FIG. 2, the network I/F 205 is an interface for connecting the designing apparatus to a network. The input device 206 may be, for example, a keyboard and/or a mouse. Various kinds of instructions or inputs may be entered through the input device 206. The output device 207 may be, for example, a display and/or a printer.

Figure 3:
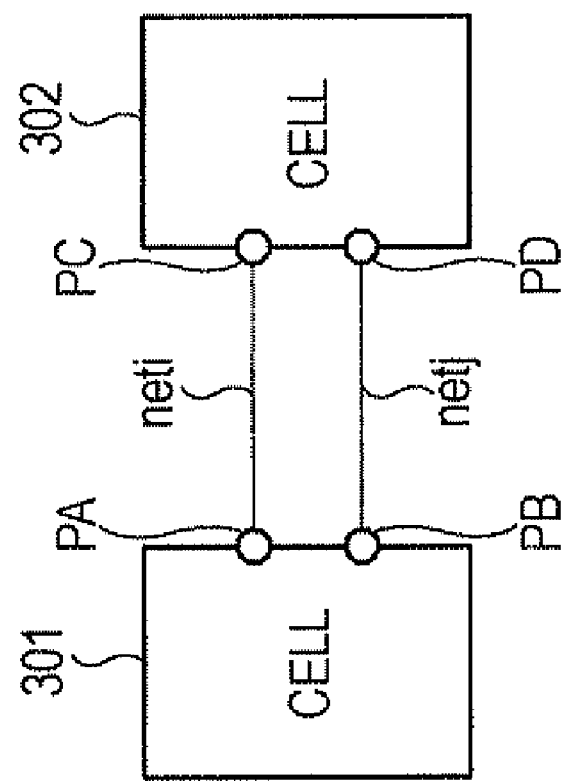
FIG. 3 is a block diagram that illustrates an example of a design-target semiconductor integrated circuit of an embodiment.

FIG. 3 illustrates an example of a semiconductor integrated circuit that is an example design target of an embodiment. The semiconductor integrated circuit includes, for example, a first cell 301 and a second cell 302. The first cell 301 has two terminals (for example, pins) PA and PB. The second cell 302 has two terminals (for example, pins) PC and PD. A node (for example, a connection line) neti interconnects the terminal PA of the first cell 301 and the terminal PC of the second cell 302. A node (for example, a connection line) netj interconnects the terminal PB of the first cell 301 and the terminal PD of the second cell 302. The cell 301 or 302 has one terminal when the cell 301 or 302 is a single-ended signals cell. The designing apparatus according to an embodiment performs processes shown in FIGS. 4 to 6, which will be described later, thereby inserting an interpolation cell between the cells 301 and 302 when a predetermined condition is met.

The CPU (corresponding to a logic synthesis unit) 202 of FIG. 2 generates netlist design data of the interconnected first and second cells 301 and 302. The CPU (corresponding to an interpolation cell inserting unit) 202 also generate netlist design data indicating that an interpolation cell is inserted between the first cell 301 and the second cell 302 when the first cell 301 is a differential signal cell.

Figure 4:
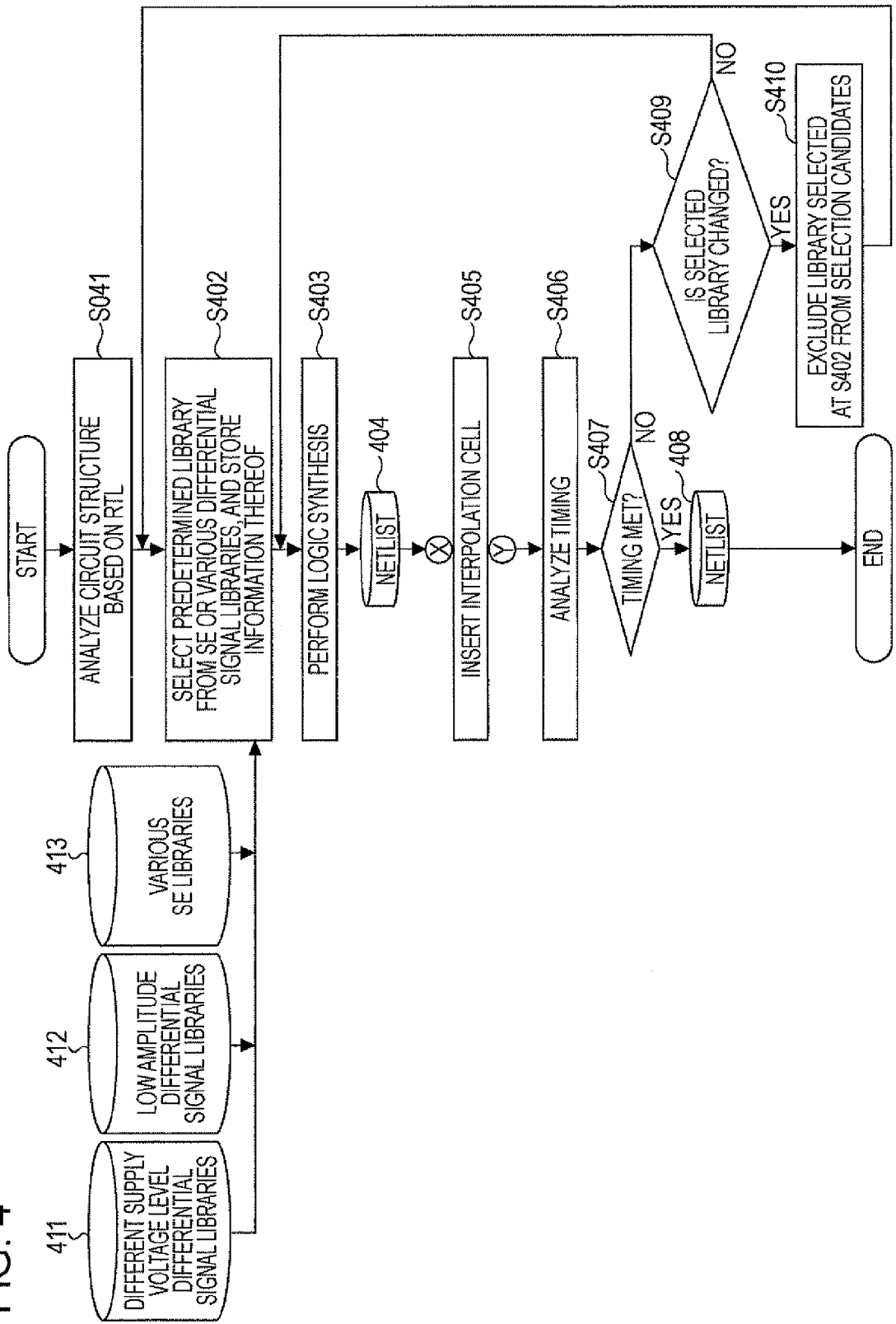
FIG. 4 is a flowchart that illustrates a method for designing a semiconductor integrated circuit performed by a designing apparatus according to an embodiment.

FIG. 4 is a flowchart showing an example of a process of a method for designing a semiconductor integrated circuit that performed, for example, by the designing apparatus of FIG. 2. As mentioned above, the CPU 202 of FIG. 2 performs the following processing operations. A circuit to be designed according to an embodiment is a digital circuit.

As shown in FIG. 4, the CPU 202 analyzes a circuit structure on the basis of register transfer level (RTL) design data at operation S401.

As further shown in FIG. 4, libraries 411 are different supply voltage level differential signal libraries for use in generation of netlist design data of differential signal cells, each of which have different supply voltage level, that receive or output supply voltage level differential signals. The libraries 411 include design data, for example, of a supply voltage level differential signal cell 702 of FIG. 7 and a supply voltage level differential signal cell 801 of FIG. 8.

As further shown in FIG. 4, libraries 412 are low amplitude differential signal libraries for use in generation of netlist design data of low amplitude differential signal cells that receive or output low amplitude differential signals. The libraries 412 include design data, for example, of a low amplitude differential signal cell 701 of FIG. 7 and a low amplitude differential signal cell 802 of FIG. 8.

As further shown in FIG. 4, the libraries 411 and 412 are differential signal libraries for use in generation of netlist design data of differential signal cells that receive or output differential signals.

As further shown in FIG. 4, libraries 413 are single-ended (SE) signal libraries for use in generation of netlist design data of single-ended signal cells that receive or output single-ended signals. The libraries 413 include, for example, the libraries 111 and 112 of FIG. 1. For example, the libraries 413 include design data of a single-ended signal cell 902 of FIG. 9 and a single-ended signal cell 1001 of FIG. 10.

As further shown in FIG. 4, each of the libraries 411 to 413 includes a plurality of libraries according to supply voltage levels and/or transistor threshold voltages Vth. The external storage device (for example, a storage unit) 208 of FIG. 2 stores the libraries 411 to 413.

As further shown in FIG. 4, the CPU 202 selects a predetermined library from the plurality of libraries 411 to 413, which differ from one another, for example, according to the supply voltage levels and/or the transistor threshold voltages Vth, and then stores information of the selected library in the RAM 204 of FIG. 2 at operation S402.

As further shown in FIG. 4, at operation S403, the CPU (for example, the logic synthesis unit) 202 of FIG. 2 performs logic synthesis on the basis of the RTL design data using the selected one of the libraries 411 to 413 to generate netlist designed data 404 of a differential signal cell or a single-ended signal cell, and stores the netlist design data 404, for example, in the external storage device 208. The netlist design data 404 of a differential signal cell is generated using the differential signal libraries 411 or 412. The netlist design data 404 of a single-ended signal cell is generated using the single-ended signal libraries 413.

As further shown in FIG. 4, the CPU (for example, the interpolation cell inserting unit) 202 of FIG. 2 performs interpolation cell insertion processing at operation S405. The details thereof will be described later with reference to FIG. 5.

As further shown in FIG. 4, at operation S406, the CPU (corresponding to a timing analyzing unit) 202 of FIG. 2 performs timing analysis on the basis of the netlist design data generated after the interpolation cell insertion processing.

As further shown in FIG. 4, if the timing is verified to be met in the timing analysis at operation S407, the CPU 202 stores the netlist design data 408 in the external storage device 208 of FIG. 2, and terminates the process. If the timing is verified not to be met in the timing analysis, the process proceeds to operation S409.

As further shown in FIG. 4, at operation S409, the CPU 202 of FIG. 2 determines whether to change the selected library. If the CPU 202 determines not to change the selected library, the process returns to operation S403, and the CPU 202 performs the logic synthesis again using another cell included in the same library. If the CPU 202 determines to change the library, the process proceeds to operation S410.

As further shown in FIG. 4, at operation S410, the CPU 202 of FIG. 2 excludes the library selected at operation S402 from the selection candidates. The process then returns to operation S402. At operation S402, the CPU 202 selects another library, and performs the logic synthesis again.

Figure 5:
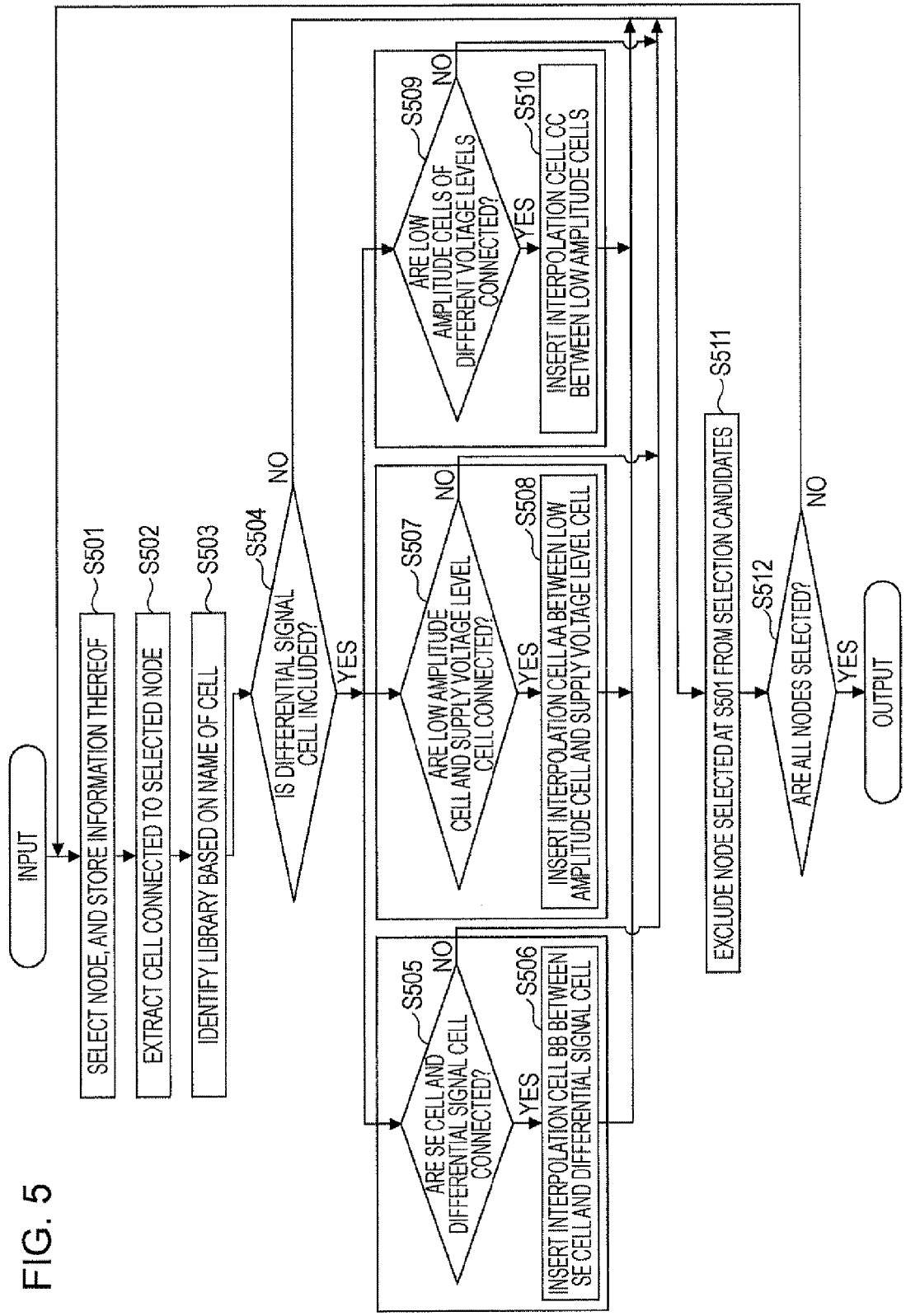
FIG. 5 is a flowchart that illustrates a designing method according to an embodiment.

FIG. 5 is a flowchart showing an example interpolation cell insertion processing performed at operation S405 of FIG. 4. The CPU 202 selects one of the nodes neti and netj of the semiconductor integrated circuit, and stores information thereof in the RAM 204 of FIG. 2 at operation S501.

As shown in FIG. 5, the CPU 202 of FIG. 2 extracts the cell 301 or 302 of FIG. 3 connected to the selected node neti or netj at operation S502.

As further shown in FIG. 5, the CPU 202 of FIG. 2 identifies a library on the basis of the name of the extracted cell 301 or 302 of FIG. 3 at operation S503. Different cell names are used for each of the libraries 411 to 413 of FIG. 4, and the same cell names are not used in the plurality of libraries 411 to 413. Accordingly, only one library is identified for one cell name.

As further shown in FIG. 5, the CPU 202 of FIG. 2 determines whether the extracted cell is a differential signal cell on the basis of the identified library at operation S504. More specifically, if the identified library is the differential signal library 411 or 412 of FIG. 4, the CPU 202 determines the extracted cell is a differential signal cell. However, if the identified library is the single-ended signal library 413 of FIG. 4, the CPU 202 determines the extracted cell is not a differential signal cell but a single-ended signal cell. If the extracted cell is the differential signal cell, operations S505 to S510 are processed in parallel or serially. The processing order of these operations is not limited. If the extracted cell is not the differential signal cell, the process proceeds to operation S511.

As described above, the CPU (for example, the interpolation cell inserting unit) 202 of FIG. 2 determines whether a cell is a differential signal cell on the basis of a name of the cell. The CPU (for example, the interpolation cell inserting unit) 202 identifies a library including the name of the cell. If the identified library is, for example, the differential signal library 411 or 412 of FIG. 4, the CPU 202 determines that the cell is a differential signal cell.

As further shown in FIG. 5, the CPU 202 of FIG. 2 determines whether a single-ended signal cell and a differential signal cell are connected at operation S505. If the connection between the single-ended signal cell and the differential signal cell exists, the process proceeds to operation S506. If the connection between the single-ended signal cell and the differential signal cell does not exist, the process proceeds to operation S511.

Figure 9:
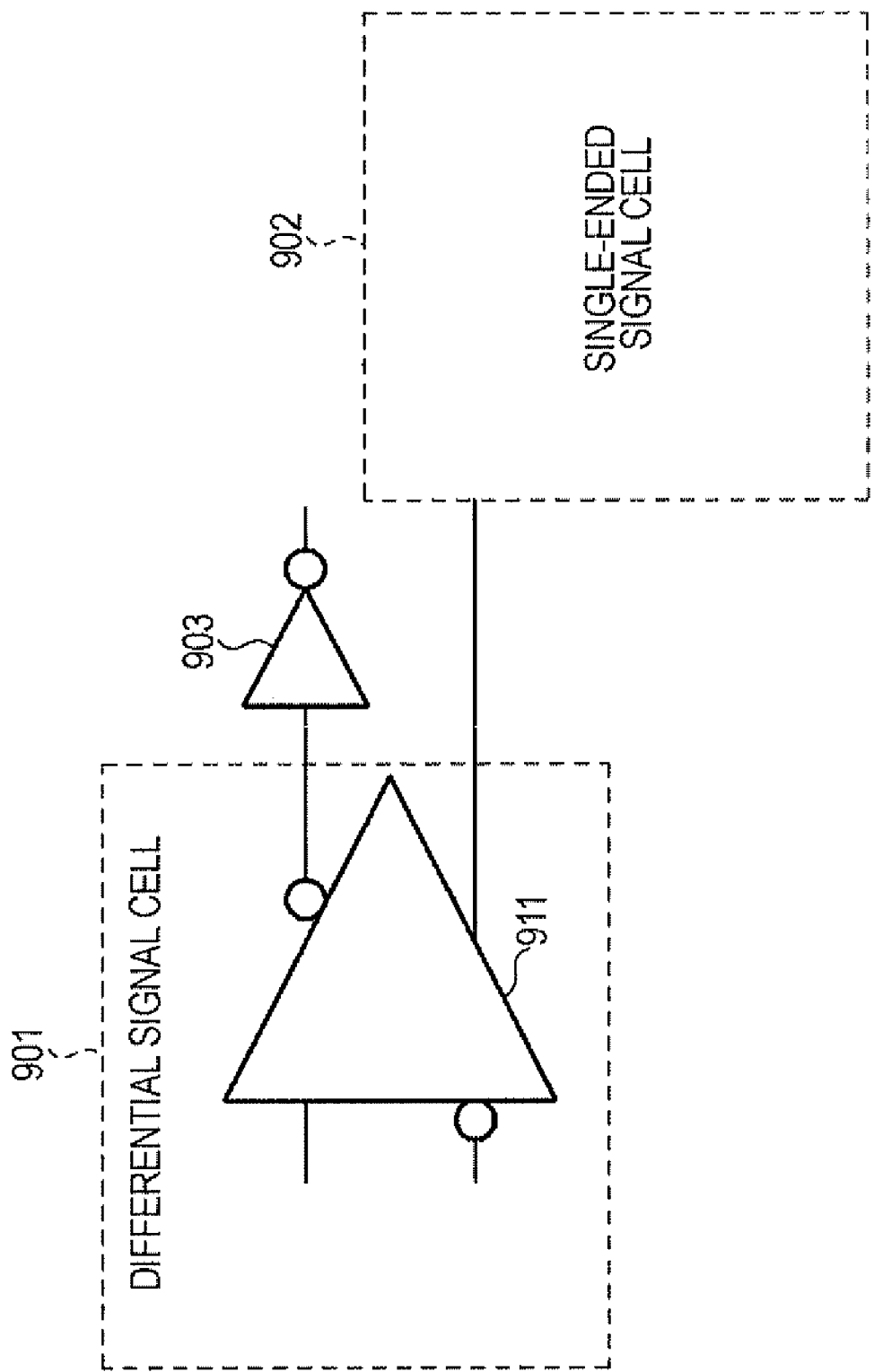
FIG. 9 is a block diagram that illustrates another cell connection example used in a semiconductor integrated circuit according to an embodiment.
Figure 10:
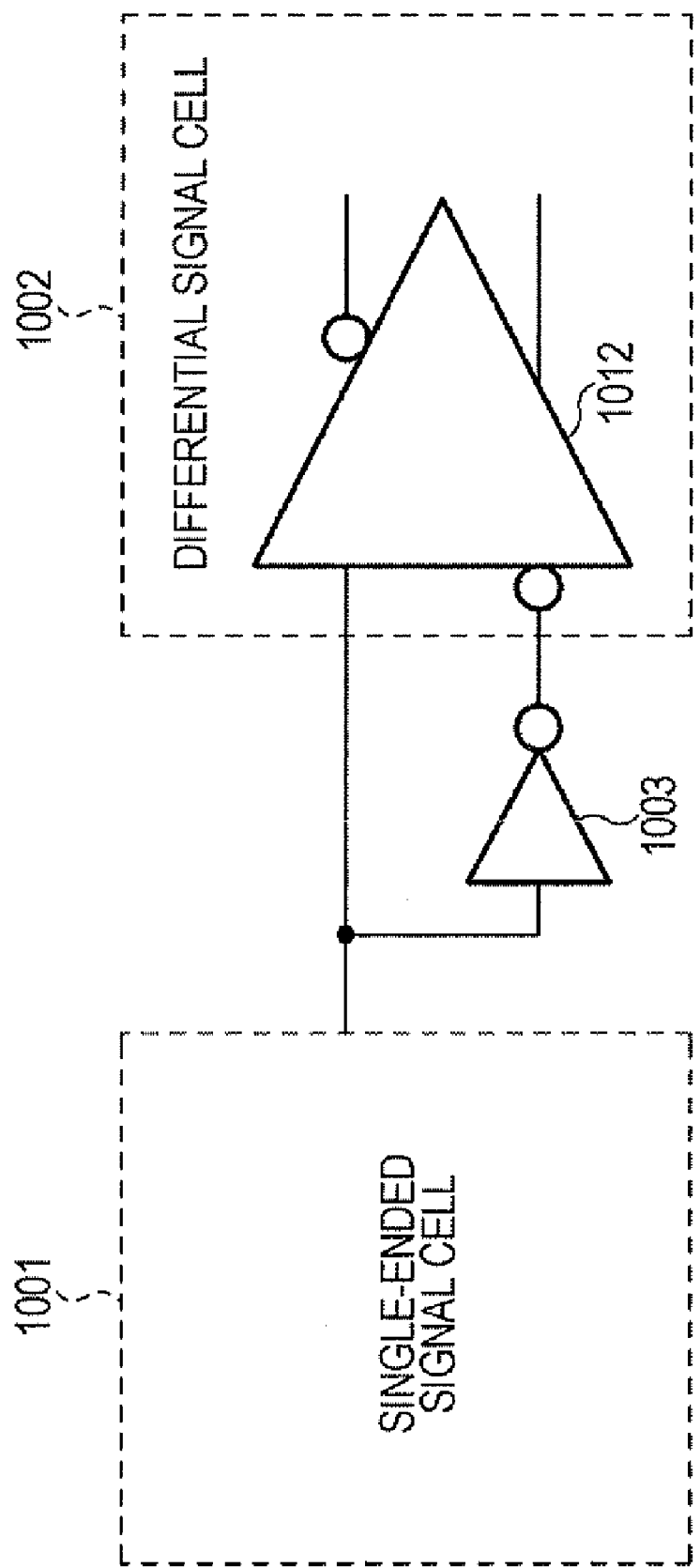
FIG. 10 is a block diagram that illustrates another cell connection example used in a semiconductor integrated circuit according to an embodiment.

As further shown in FIG. 5, the CPU 202 of FIG. 2 generates netlist design data indicating that an interpolation cell 903 of FIG. 9 or 1003 of FIG. 10 is inserted between the single-ended signal cell and the differential signal cell. The process then proceeds to operation S511.

That is, when the first cell 301 of FIG. 3 is a differential signal cell and the second cell 302 of FIG. 3 is a single-ended signal cell, the CPU (for example, the interpolation cell inserting unit) 202 of FIG. 2 generates netlist design data indicating that the interpolation cell 903 of FIG. 9 or 1003 of FIG. 10 is inserted between the first cell 301 and the second cell 302.

As shown in FIG. 9 to be described later, when a first cell 901 of FIG. 9 outputs differential signals and a second cell 902 receives a single-ended signal, the CPU (for example, the interpolation cell inserting unit) 202 generates netlist design data indicating that one of the differential signal lines of the first cell 901 is connected to a single-ended signal line of the second cell 902 and the other differential signal line is connected to a load (e.g., an inverter) 903 of FIG. 9 serving as an interpolation cell.

In addition, as shown in FIG. 10, when a second cell 1001 outputs a single-ended signal and a first cell 1002 receives differential signals, the CPU (for example, the interpolation cell inserting unit) 202 of FIG. 2 generates netlist design data indicating that one single-ended signal line of the second cell 1001 is connected to one of the differential signal lines of the first cell 1002 and an inverter 1003 of FIG. 10 is inserted as an interpolation cell between the single-ended signal line of the second cell 1001 and the other differential signal line of the first cell 1002.

Figure 7:
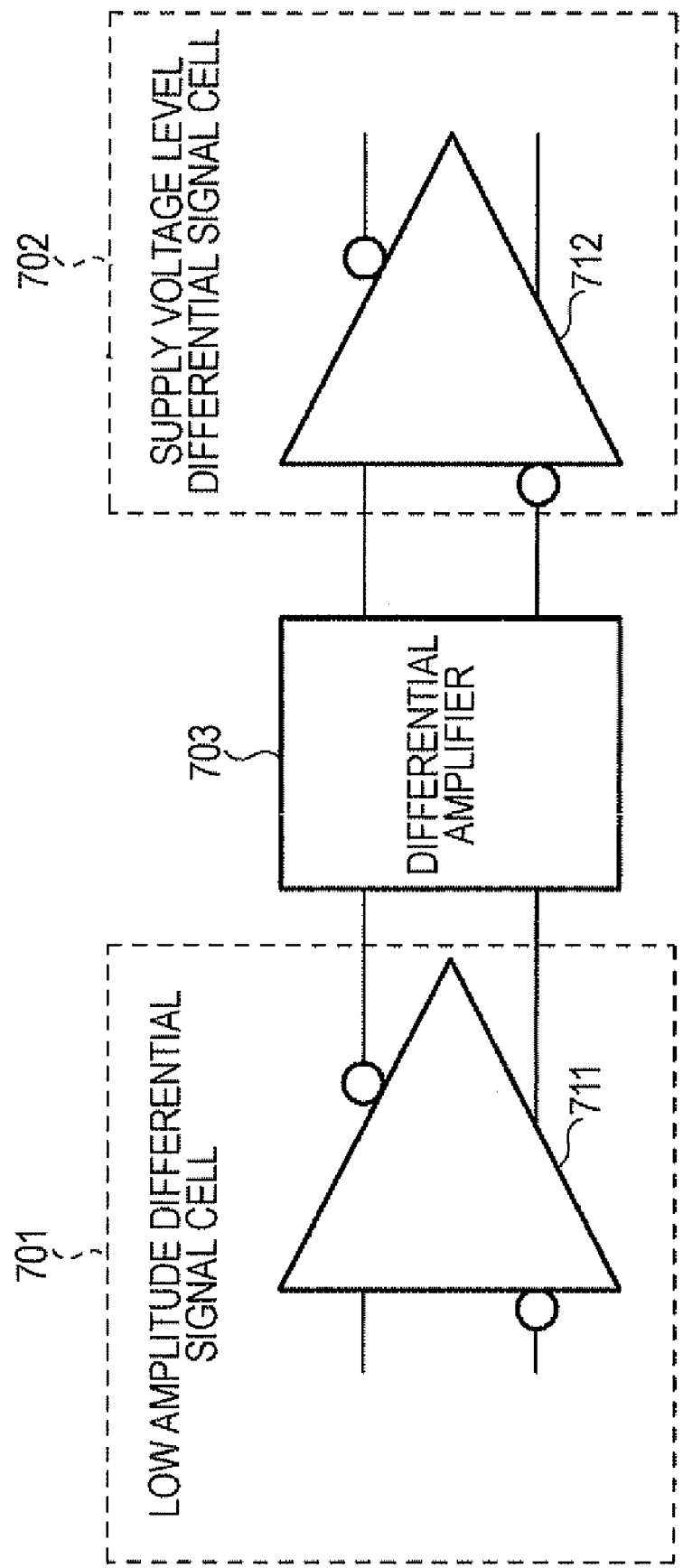
FIG. 7 is a block diagram that illustrates one cell connection example used in a semiconductor integrated circuit according to an embodiment.
Figure 8:
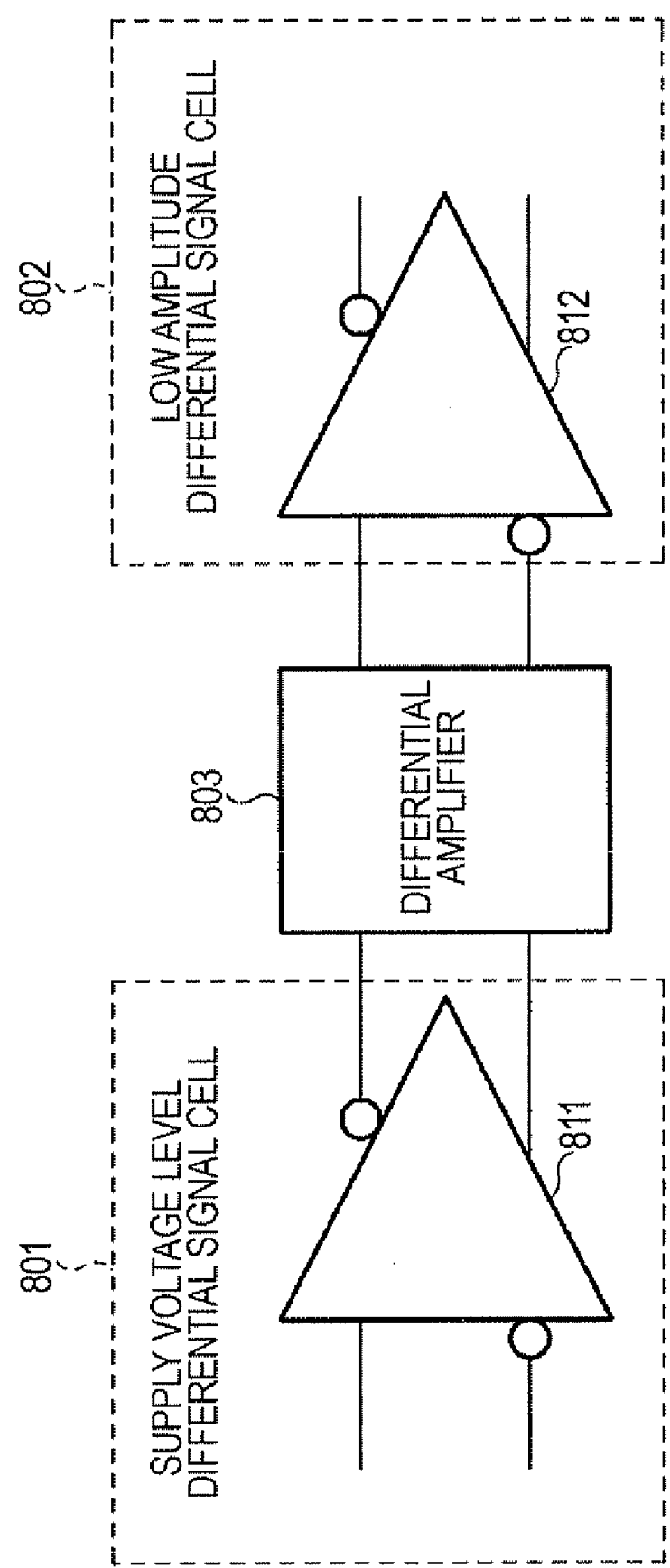
FIG. 8 is a block diagram that illustrates another cell connection example used in a semiconductor integrated circuit according to an embodiment.

As further shown in FIG. 5, at operation S507, the CPU 202 of FIG. 2 determines whether a low amplitude differential signal cell is connected to a supply voltage level differential signal cell as shown in FIGS. 7 and 8 to be described later. If the connection between the low amplitude differential signal cell and the supply voltage level differential signal cell exists, the process proceeds to operation S508. If the connection between the low amplitude differential signal cell and the supply voltage level differential signal cell does not exist, the process proceeds to operation S511.

As further shown in FIG. 5, at operation S508, the CPU 202 of FIG. 2 generates netlist design data indicating that an interpolation cell 703 of FIG. 7 or 803 of FIG. 8 is inserted between the low amplitude differential signal cell and the supply voltage level differential signal cell. The process then proceeds to operation S511.

When the first and second cells 301 and 302 of FIG. 3 are differential signal cells and differential signals received or output by the first cell 301 and differential signals received or output by the second cell 302 have different amplitudes, the CPU (for example, the interpolation cell inserting unit) 202 of FIG. 2 generates netlist design data indicating that an amplitude converting circuit (e.g., a differential amplifier) 703 of FIG. 7 or 803 of FIG. 8 for converting the amplitude of the differential signals is inserted as the interpolation cell. The differential amplifier 703 of FIG. 7 or 803 of FIG. 8 may convert the amplitude and the direct-current component level of the differential signals.

Figure 11:
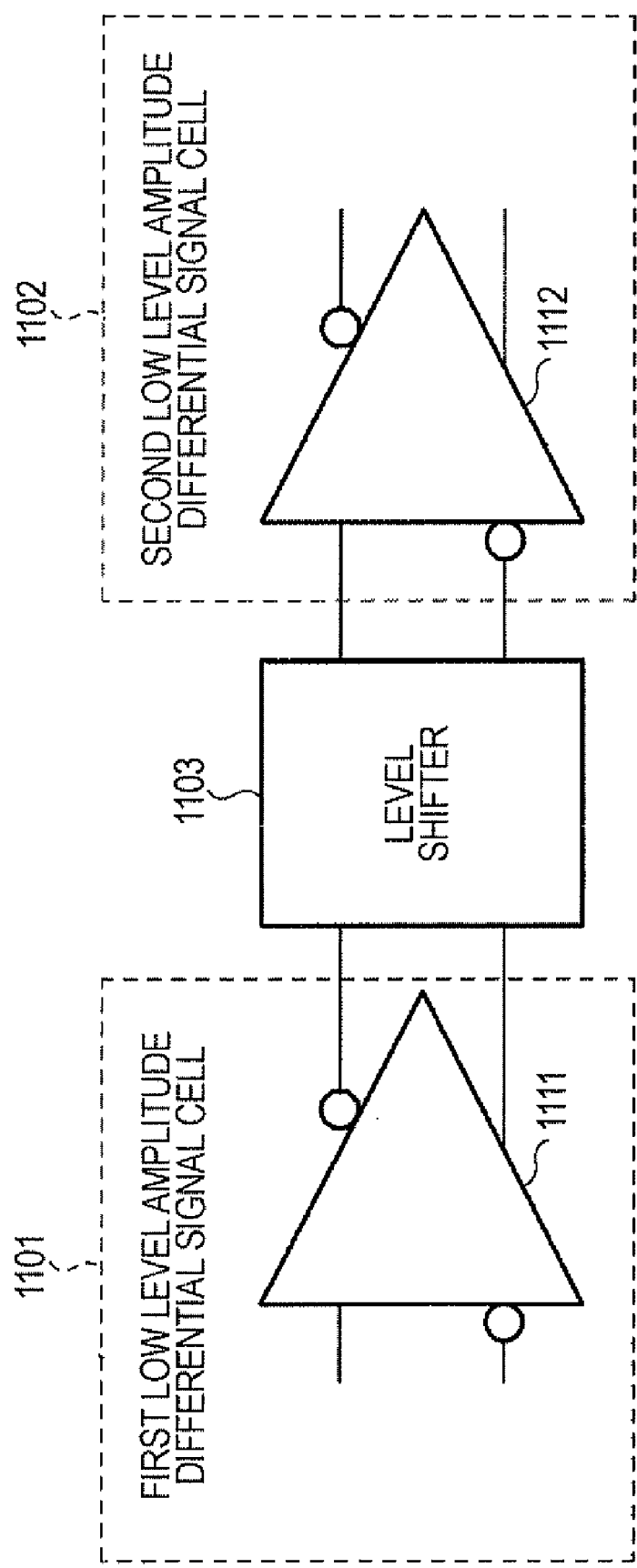
FIG. 11 is a block diagram that illustrates another cell connection example used in a semiconductor integrated circuit according to an embodiment.

As further shown in FIG. 5, at operation S509, the CPU 202 of FIG. 2 determines whether low amplitude differential signal cells having different direct-current component levels (direct voltage levels) are connected as shown in FIG. 11 to be described later. If the connection between the low amplitude differential signal cells exists, the process proceeds to operation S510. If the connection between the low amplitude differential signal cells does not exist, the process proceeds to operation S511.

As further shown in FIG. 5, the CPU 202 of FIG. 2 generates netlist design data indicating that an interpolation cell 1103 of FIG. 11 is inserted between the low amplitude differential signal cells at operation S510. The process then proceeds to operation S511.

When first and second cells 1101 and 1102 are differential signal cells and differential signals received or output by the first cell 1101 and differential signals received or output by the second cell 1102 have different direct-current component levels as shown in FIG. 11 to be described later, the CPU (for example, the interpolation cell inserting unit) 202 of FIG. 2 generates netlist design data indicating that a level shifter 1103 of FIG. 11 for converting the direct-current component level of the differential signals is inserted as the interpolation cell.

As further shown in FIG. 5, the CPU 202 of FIG. 2 excludes the node selected at operation S501 from selection candidates at operation S511. The process then proceeds to operation S512. At operation S512, the CPU 202 determines whether all of the nodes included in the semiconductor integrated circuit have been selected. If the all of the nodes have been selected, the process ends. If the all of the nodes have not been selected, the process returns to operation S501, and the aforementioned operations are repeated regarding other nodes.

Figure 6:
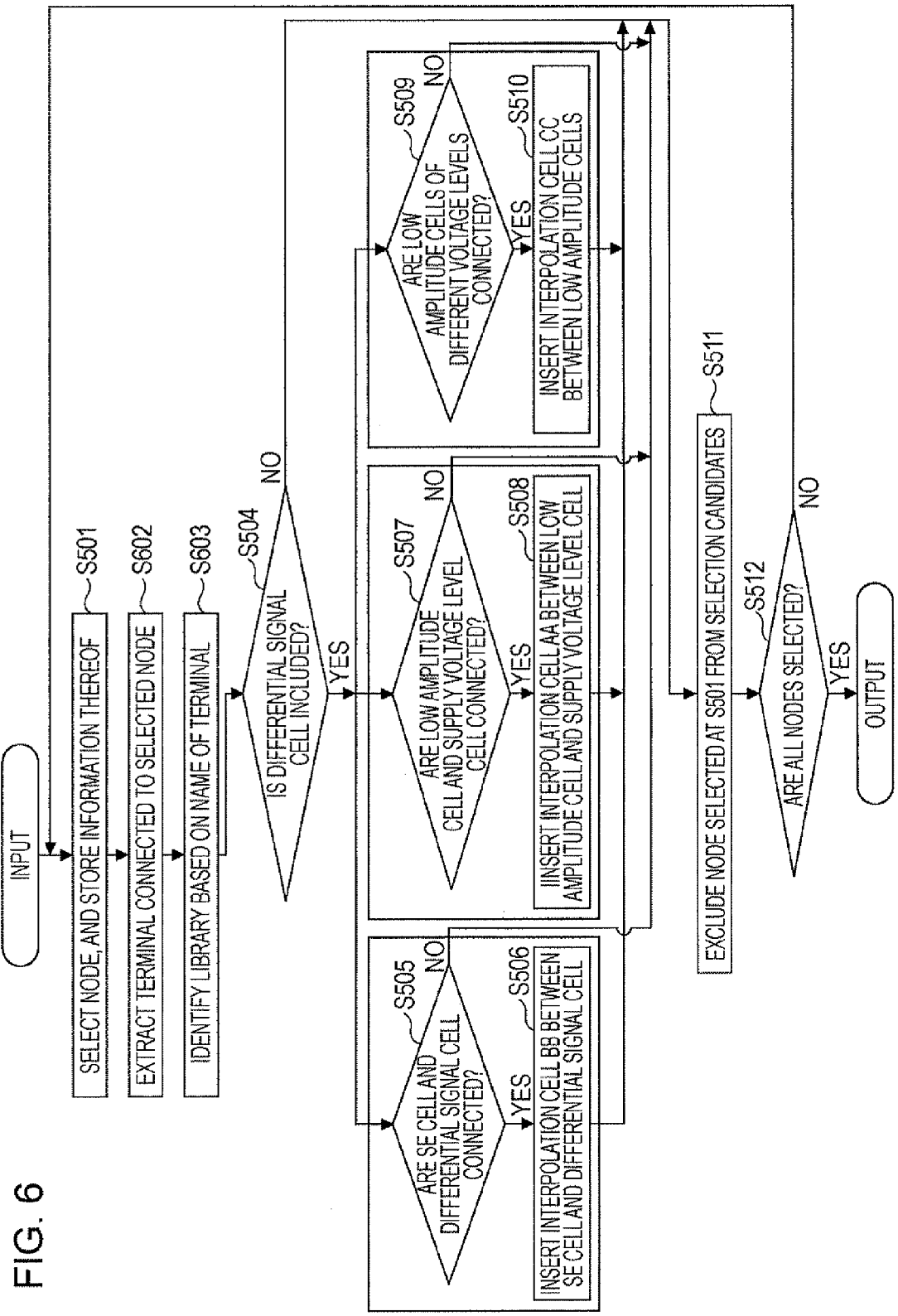
FIG. 6 is a flowchart that illustrates a designing method according to an embodiment.

FIG. 6 is an example detailed flowchart of part of the designing method of FIG. 4. FIG. 6 shows an example interpolation cell insertion processing performed at operation S405 of FIG. 4.

As shown in FIG. 6, operations S502 and S503 of FIG. 5 are replaced with operations S602 and S603 in FIG. 6.

As further shown in FIG. 6, at operation 3501, the CPU 202 of FIG. 2 selects one of the nodes neti and netj included in the semiconductor integrated circuit, and stores information thereof in the RAM 204 of FIG. 2.

As further shown in FIG. 6, at operation S602, the CPU 202 of FIG. 2 extracts a terminal PA, PB, PC, or PD of FIG. 3 of the cells connected to the selected node neti or netj.

As further shown in FIG. 6, at operation S603, the CPU 202 of FIG. 2 identifies a library on the basis of a name of the extracted terminal. Different terminal names are used for each of the libraries 411 to 413 of FIG. 4, and the same terminal names are not used in the plurality of libraries 411 to 413. Accordingly, only one library is identified for one terminal name.

As further shown in FIG. 6, at operation S504, the CPU 202 of FIG. 2 determines whether the cell is a differential signal cell on the basis of the identified library. More specifically, if the identified library is the differential signal library 411 or 412 of FIG. 4, the CPU 202 determines that the cell is a differential signal cell. However, if the identified library is the single-ended signal library 413, the CPU 202 determines that the cell is not a differential signal cell but a single-ended signal cell. If the cell is the differential signal cell, the CPU 202 performs operations S505 to S510 in parallel or serially. If the cell is not the differential signal cell, the process proceeds to operation S511. The processing performed thereafter is similar to that shown in FIG. 5.

As described above, the CPU (for example, interpolation cell inserting unit) 202 of FIG. 2 determines whether a cell is a differential signal cell on the basis of the name of the terminal of the cell. More specifically, the CPU (for example, the interpolation cell inserting unit) 202 identifies a library including the name of the terminal of the cell. If the identified library is the differential signal library 411 or 412, the CPU 202 determines that the cell is a differential signal cell.

Terminals are written closer to the node than a cell in design data included in libraries. Accordingly, the retrieval time becomes shorter in the case of retrieving a terminal connected to the node than a case of retrieving a cell connected to the node after the selection of a node. The use of the processing of FIG. 6 may be shorten the processing time of FIG. 5.

FIG. 7 shows one cell connection method according to an embodiment. A low amplitude differential signal cell 701 and a supply voltage level differential signal cell 702 correspond to the cells 301 and 302 of FIG. 3, respectively.

The low amplitude differential signal cell 701 includes a differential output buffer 711, and outputs low amplitude differential signals. Differential signals are two signals having opposite phases. The low amplitude differential signals have the amplitude smaller than the supply voltage. For example, the supply voltage of the low amplitude differential signal cell 701 is equal to 1.2V, and the low amplitude differential signal cell 701 outputs low amplitude differential signals of 0.9V±0.2V. The direct-current component level of the low amplitude differential signals is equal to 0.9V and the amplitude thereof is ±0.2V. The low amplitude differential signals change between 0.7V and 1.1V.

As shown in FIG. 7, the supply voltage level differential signal cell 702 includes a differential input buffer 712, and receives supply voltage level differential signals. The supply voltage level differential signals are differential signals having the amplitude of the supply voltage. For example, the supply voltage of the supply voltage level differential signal cell 702 is equal to 1.2V, and the supply voltage level differential signal cell 702 receives differential signals that change between the supply voltage of 1.2V and the reference voltage of 0V.

As further shown in FIG. 7, the low amplitude differential signal cell 701 is connected to the supply voltage level differential signal cell 702 by inserting an interpolation cell 703 between the low amplitude differential signal cell 701 and the supply voltage level differential signal cell 702. The interpolation cell 703 may be a differential amplifier. The low amplitude differential signal cell 701 outputs low amplitude differential signals to the differential amplifier 703. The differential amplifier 703 receives the low amplitude differential signals from the low amplitude differential signal cell 701, amplifies the level of the low amplitude differential signals (0.7V to 1.1V) to the level of the supply voltage level differential signals (0V to 1.2V), and then outputs the supply voltage level differential signals to the supply voltage level differential signal cell 702. The supply voltage level differential signal cell 702 receives the supply voltage level differential signals from the differential amplifier 703. The differential amplifier 703 converts the amplitude and the direct-current component level of the low amplitude differential signals to generate the supply voltage level differential signals. Alternatively, the differential amplifier 703 converts the amplitude of the low amplitude differential signals to generate the supply voltage level differential signals.

FIG. 8 shows another cell connection method according to an embodiment. A supply voltage level differential signal cell 801 and a low amplitude differential signal cell 802 correspond to the cells 301 and 302 of FIG. 3, respectively. The supply voltage level differential signal cell 801 includes a differential output buffer 811, and outputs supply voltage level differential signals. For example, the supply voltage of the supply voltage level differential signal cell 801 is equal to 1.2V, and the supply voltage level differential signal cell 801 outputs differential signals that change between the supply voltage of 1.2V and the reference voltage of 0V.

As shown in FIG. 8, the low amplitude differential signal cell 802 includes a differential input buffer 812, and receives low amplitude differential signals. For example, the supply voltage of the low amplitude differential signal cell 802 is equal to 1.2V, and the low amplitude differential signal cell 802 receives low amplitude differential signals of 0.8V±0.2V. The direct-current component level and the amplitude of the low amplitude differential signals are equal to 0.8V and ±0.2V, respectively. The low amplitude differential signals change between 0.6V and 1.0V.

As further shown in FIG. 8, the supply voltage level differential signal cell 801 is connected to the low amplitude differential signal cell 802 by inserting an interpolation cell 803 between the supply voltage level differential signal cell 801 and the low amplitude differential signal cell 802. The interpolation cell 803 may be a differential amplifier. The supply voltage level differential signal cell 801 outputs supply voltage level differential signals to the differential amplifier 803. The differential amplifier 803 receives the supply voltage level differential signals from the supply voltage level differential signal cell 801, amplifies the level of the supply voltage level differential signals (0V to 1.2V) to the level of low amplitude differential signals (0.6V to 10V), and outputs the low amplitude differential signals to the low amplitude differential signal cell 802. The low amplitude differential signal cell 802 receives the low amplitude differential signals from the differential amplifier 803. The differential amplifier 803 converts the amplitude and the direct-current component level of the supply voltage level differential signals to generate the low amplitude differential signals. Alternatively, the differential amplifier 803 converts the amplitude of the supply voltage level differential signals to generate the low amplitude differential signals.

FIG. 9 shows another cell connection method according to an embodiment. A differential signal cell 901 and a single-ended signal cell 902 correspond to the cells 301 and 302 of FIG. 3, respectively. The differential signal cell 901 includes a differential output buffer 911, and outputs differential signals. The differential signal cell 901 may be the low amplitude differential signal cell 701 of FIG. 7 or the supply voltage level differential signal cell 801 of FIG. 8. The single-ended signal cell 902 receives a single-ended signal. A single-ended signal is one signal based on the reference voltage (for example, the ground voltage). When the differential signals are supply voltage level differential signals, the processing is as described above. When the differential signals are low amplitude differential signals, an interpolation cell 903903 is inserted after the level of the low amplitude differential signals is amplified to the level of the supply voltage level differential signals.

As shown in FIG. 9, the differential signal cell 901 is connected to the single-ended signal cell 902 by inserting the interpolation cell 903 between the differential signal cell 901 and the single-ended signal cell 902. The interpolation cell 903 may be a load, such as an inverter. One differential signal line (e.g., a positive differential signal line) of the differential signal cell 901 is connected to a single-ended signal line of the single-ended signal cell 902. The load (e.g., an inverter) 903 is connected to the other differential single line (e.g., a negative differential signal line) of the differential signal cell 901 as an interpolation cell. An input terminal of the inverter 903 is connected to the negative differential signal line of the differential signal cell 901, and an output terminal thereof is kept open. An output signal of the inverter 903 may not be used.

When the negative differential signal line of the differential signal cell 901 is kept open without providing the load 903 of FIG. 9, a load exists in the positive differential signal line of the differential signal cell 901 and a load does not exist in the negative differential signal line. In such a case, since the loads of the positive and negative differential signal lines differ from one another, the positive differential signal is distorted.

As further shown in FIG. 9, providing the load 903 prevents the single-ended signal that is a positive differential signal from being distorted. As described above, by using the positive differential signal as the single-ended signal, the differential signal cell 901 is connected to the single-ended signal cell 902.

FIG. 10 shows another cell connection method according to an embodiment. A single-ended signal cell 1001 and a differential signal cell 1002 correspond to the cells 301 and 302 of FIG. 3, respectively. The single-ended signal cell 1001 outputs a single-end signal. The differential signal cell 1002 includes a differential input buffer 1012, and receives differential signals. The differential signal cell 1002 may be the supply voltage level differential signal cell 702 of FIG. 7 or the low amplitude differential signal cell 802 of FIG. 8. In the case of supply voltage level differential signals, the processing is as described above. In the case of low amplitude differential signals, the level of the low amplitude differential signals is amplified to the level of the supply voltage level differential signals after inserting an interpolation cell 1003.

As shown in FIG. 10, the single-ended signal cell 1001 is connected to the differential signal cell 1002 by inserting the interpolation cell 1003 between the single-ended signal cell 1001 and the differential signal cell 1002. The interpolation cell 1003 may be an inverter. A single-ended signal line of the single-ended signal cell 1001 is connected to a differential signal line (e.g., a positive differential signal line) of the differential signal cell 1002. The inverter 1003 is inserted between the single-ended signal line of the single-ended signal cell 1001 and the other differential signal line (e.g. a negative differential signal line) of the differential signal cell 1002 as an interpolation cell.

As further shown in FIG. 10, a single-ended signal output by the single-ended signal cell 1001 is a digital signal, such as a clock signal. The inverter 1003 logically inverts the single-ended signal, and outputs the inverted signal. The single-ended signal and the logically inverted signal thereof serve as differential signals, and are input to the differential signal cell 1002. As described above, a single-ended signal is converted into differential signals using the inverter 1003, which allows the single-ended signal cell 1001 and the differential signal cell 1002 to be connected to each other.

FIG. 11 shows another cell connection method according to an embodiment. A low amplitude differential signal cell 1101 and a low amplitude differential signal cell 1102 correspond to the cells 301 and 302, respectively. The low amplitude differential signal cell 1101 includes a differential output buffer 1111, and outputs low amplitude differential signals having a first direct-current component level (e.g., 0.9V). For example, the supply voltage of the low amplitude differential signal cell 1101 is equal to 1.2V, and the low amplitude differential signal cell 1101 outputs low amplitude differential signals of 0.9V±0.2V. The direct-current component level and the amplitude of the low amplitude differential signals are equal to 0.9V and ±0.2V, respectively. The low amplitude differential signals change between 0.7V and 1.1V.

As shown in FIG. 11, the low amplitude differential signal cell 1102 includes differential input buffer 1112, and receives low amplitude differential signals having a second direct-current component level (e.g., 0.8V). For example, the supply voltage of the low amplitude differential signal cell 1102 is equal to 1.2V, and the low amplitude differential signal cell 1102 receives low amplitude differential signals of 0.8V±0.2V. The direct-current component level and the amplitude of the low amplitude differential signals are equal to 0.8V and ±0.2V, respectively. The low amplitude differential signals change between 0.6V and 1.0V.

As further shown in FIG. 11, low amplitude differential signals output by the low amplitude differential signal cell 1101 and low amplitude differential signals received by the low amplitude differential signal cell 1102 have different direct-current component levels and the same amplitude. A level shifter 1103 for converting (shifting) the direct-current component level of the differential signals is inserted between the low amplitude differential signal cells 1101 and 1102 as an interpolation cell. The low amplitude differential signal cell 1101 outputs differential signals of 0.9V±0.2V to the level shifter 1103. The level shifter 1103 shifts the direct-current component level of the differential signals (0.9V±0.2V) output by the low amplitude differential signal cell 1101 to 0.8V from 0.9V, and outputs low amplitude differential signals of 0.8V±0.2V to the low amplitude differential signal cell 1102. The low amplitude differential signal cell 1102 receives the low amplitude differential signals of 0.8V±0.2V. As described above, the level shifter 1103 shifts the direct-current component level of differential signals, thereby allowing the low amplitude signal cells 1101 and 1102 having different direct-current component levels to be connected to each other.

In the aforementioned example embodiments, design of circuits using differential signals may be performed automatically. Since logic synthesis is performed on the basis of RTL (Register Transfer Level) design data, the designing digital circuits using differential signals becomes efficient.

The use of an interpolation cell automates processing for connecting differential signal cells having different amplitudes, processing for connecting a differential signal cell and a single-ended signal cell, or processing for connecting differential signal cells having different direct-current component levels. Automatic layout processing with avoiding interference from others, such as crosstalk, may be performed.

The aforementioned example embodiments may be realized by using the computer of FIG. 2 executing a program. In addition, in supplying the program to a computer, e.g., a computer-readable recording medium, such as a CD-ROM, having the program recorded thereon and transmission media, such as the Internet, that transmits the program, may be used in the aforementioned example embodiments. In addition, a computer program product such as a computer-readable recording medium having the program recorded thereon may be used in the aforementioned example embodiments. It is noted that the program, the recording medium, the transmission media, and the computer program product may also be included. For example, a flexible disk, a hard disk, an optical disk such as a CD-ROM, a magneto-optical disk, a magnetic tape, a nonvolatile memory card, or a ROM may used as the recording medium.

In the aforementioned example embodiments, design of circuits using differential signals may be performed automatically. Since logic synthesis is performed on the basis of register transfer level design data, the designing digital circuit using differential signals becomes efficient.

Although a few embodiments have been shown and described, it would be appreciated by those skilled in the art that changes might be made in these embodiments without departing from the principles and spirit of the invention, the scope of which is defined in the claims and their equivalents.

What is claimed is:

1. An apparatus for designing a semiconductor device comprising:
a storage unit configured to a differential signal library for use in generation of a design data of a differential signal cell that receives or outputs differential signals;
a logic synthesis unit performing logic synthesis based on the differential signal library configured to the storage unit to generate a netlist design data of the differential signal cell that receives or outputs the differential signals; and
an interpolation cell inserting unit inserting an amplitude converting circuit converting the amplitude of the differential signals as an interpolation cell between a first cell and a second cell when the first cell and the second cell are differential signal cells and differential signals received or output by the first cell and differential signals received or output by the second cell have different amplitudes.

2. The apparatus according to claim 1, wherein the logic synthesis unit performs the logic synthesis based on register transfer level design data.

3. The apparatus according to claim 2, further comprising:
an interpolation cell inserting unit,
wherein the logic synthesis unit generates the netlist design data of the first cell and the second cell that are connectable each other, and
wherein in a case that the first cell is a differential signal cell, the interpolation cell inserting unit generates the netlist design data indicating that the interpolation cell is inserted between the first cell and the second cell.

4. The apparatus according to claim 3, wherein in a case that the first cell is a differential signal cell and the second cell is a single-ended signal cell that receives or outputs a single-ended signal, the interpolation cell inserting unit generates the netlist design data indicating that an interpolation cell is inserted between the first cell and the second cell.

5. The apparatus according to claim 4, wherein, in a case that the first cell outputs differential signals and the second cell receives a single-ended signal, the interpolation cell inserting unit connects one of the differential signals of the first cell to the single-ended signal of the second cell and connects the other differential signal of the first cell to a load serving as the interpolation cell.

6. The apparatus according to claim 5, wherein the load is an inverter.

7. The apparatus according to claim 4, wherein, in a case that the second cell outputs a single-ended signal and the first cell receives differential signals, the interpolation cell inserting unit connects the single-ended signal of the second cell to one of the differential signals of the first cell and inserts a load between the single-ended signal of the second cell and the other differential signal of the first cell as the interpolation cell.

8. The apparatus according to claim 2, wherein the storage unit is configured to a single-ended signal library for use in generation of design data of a single-ended signal cell that receives or outputs a single-ended signal, and wherein the logic synthesis unit generates the netlist design data of a differential signal cell and a single-ended signal cell using the differential signal library and the single-ended signal library.

9. The apparatus according to claim 2, further comprising:
a timing analyzing unit performing timing analysis on the basis of the netlist design data.

10. The apparatus according to claim 1, wherein the amplitude converting circuit is a differential amplifier.

11. An apparatus for designing a semiconductor device comprising:
a storage unit configured to a differential signal library for use in generation of a design data of a differential signal cell that receives or outputs differential signals;
a logic synthesis unit performing logic synthesis based on the differential signal library configured to the storage unit to generate a netlist design data of the differential signal cell that receives or outputs the differential signals; and
an interpolation cell inserting unit inserting a level shifter for shifting the direct-current component level of differential signals as the interpolation cell between a first cell and a second cell when the first cell and the second cell are differential signal cells and differential signals received or output by the first cell and differential signals received or output by the second cell have different direct-current component levels.

12. An apparatus for designing a semiconductor device comprising:
a storage unit configured to a differential signal library for use in generation of a design data of a differential signal cell that receives or outputs differential signals;
a logic synthesis unit performing logic synthesis based on the differential signal library configured to the storage unit to generate a netlist design data of the differential signal cell that receives or outputs the differential signals; and
an interpolation cell inserting unit inserting unit generating the netlist design data indicating that an interpolation cell is inserted between a first cell and a second cell that are connectable each other when the first cell is a differential signal cell,
wherein the interpolation cell inserting unit determines whether the first cell is a differential signal cell on the basis of a name of the first cell.

13. The apparatus according to claim 12, wherein the interpolation cell inserting unit identifies a library including the name of the first cell, and determines that the first cell is a differential signal cell if the identified library is the differential signal library.

14. An apparatus for designing a semiconductor device comprising:
a storage unit configured to a differential signal library for use in generation of a design data of a differential signal cell that receives or outputs differential signals;
a logic synthesis unit performing logic synthesis based on the differential signal library configured to the storage unit to generate a netlist design data of the differential signal cell that receives or outputs the differential signals; and
an interpolation cell inserting unit inserting unit generating the netlist design data indicating that an interpolation cell is inserted between a first cell and a second cell that are connectable each other when the first cell is a differential signal cell and determining whether the first cell is a differential signal cell on the basis of a name of a terminal of the first cell.

15. The apparatus according to claim 14, wherein the interpolation cell inserting unit identifies a library including the name of the terminal of the first cell, and determines that the first cell is a differential signal cell if the identified library is the differential signal library.

16. A semiconductor device designing method for designing the semiconductor device, the semiconductor device designing method comprising:
causing a computer processor to execute operations of:
performing logic synthesis based on a differential signal library for use in generation of a design data of a differential signal cell that receives or outputs differential signals;
generating a netlist design data of the differential signal cell that receives or outputs the differential signals based on the logic synthesis; and
inserting an amplitude converting circuit converting the amplitude of the differential signals as a interpolation cell between a first cell and a second cell when the first cell and the second cell are differential signal cells and differential signals received or output by the first cell and differential signals received or output by the second cell have different amplitudes.

17. The semiconductor device designing method according to claim 16, further comprising:
generating the netlist design data of the first cell and the second cell that are connectable to each other when logic synthesis for generating the netlist design data is performed; and
inserting an interpolation cell between the first cell and the second cell if the first cell is a differential signal cell.

18. A semiconductor device designing program for designing the semiconductor device, the semiconductor device designing program causing a computer to execute a method, the method comprising:
performing using the computer logic synthesis based on a differential signal library for use in generation of a design data of a differential, signal cell that receives or outputs differential signals;
generating using the computer netlist design data of the differential signal cell that receives or outputs the differential signals based on the logic synthesis; and
inserting using the computer an amplitude converting circuit converting the amplitude of the differential signals as a interpolation cell between a first cell and a second cell when the first cell and the second cell are differential signal cells and differential signals received or output by the first cell and differential signals received or output by the second cell have different amplitudes.

19. The semiconductor device designing program according to claim 18, further comprising:
generating a netlist design data of the first cell and the second cell that are connectable to each other when logic synthesis for generating the netlist design data is performed; and
inserting an interpolation cell between the first cell and the second cell if the first cell is a differential signal cell.

* * * * *

UNITED STATES PATENT AND TRADEMARK OFFICE
CERTIFICATE OF CORRECTION

PATENT NO. : 7,831,952 B2
APPLICATION NO. : 12/032347
DATED : November 9, 2010
INVENTOR(S) : Koji Migita It is certified that error appears in the above-identified patent and that said Letters Patent is hereby corrected as shown below:

Column 13, Line 34 in Claim 12, after "inserting unit" delete "inserting unit". (Second Occurrence)

Column 13, Line 57, in Claim 14 after "inserting unit" delete "inserting unit". (Second Occurrence)

Signed and Sealed this
Twenty-fifth Day of January, 2011

David J. Kappos
*Director of the United States Patent and Trademark Office*